US012775218B2

(12) United States Patent
Badr

(10) Patent No.: US 12,775,218 B2
(45) Date of Patent: Oct. 27, 2026

(54) METROLOGY METHOD

(71) Applicant: ASML NETHERLANDS B.V., Veldhoven (NL)

(72) Inventor: Elie Badr, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 803 days.

(21) Appl. No.: 17/789,160

(22) PCT Filed: Dec. 19, 2020

(86) PCT No.: PCT/EP2020/087345
§ 371 (c)(1),
(2) Date: Jun. 24, 2022

(87) PCT Pub. No.: WO2021/130142
PCT Pub. Date: Jul. 1, 2021

(65) Prior Publication Data

US 2023/0035488 A1 Feb. 2, 2023

(30) Foreign Application Priority Data

Dec. 24, 2019 (EP) .................................... 19219624

(51) Int. Cl.
*G03F 7/00* (2006.01)
*G06T 7/00* (2017.01)
(Continued)

(52) U.S. Cl.
CPC ...... *G03F 7/70633* (2013.01); *G03F 7/70625* (2013.01); *G06T 7/001* (2013.01);
(Continued)

(58) Field of Classification Search
CPC ............. G03F 7/70625; G03F 7/70633; G03F 7/70683; G06T 2207/10061;
(Continued)

(56) References Cited

U.S. PATENT DOCUMENTS 10,593,032 B2 * 3/2020 Ryu .......................... G06T 7/11
2017/0010541 A1 1/2017 Mossavat et al.
2019/0271542 A1 9/2019 Shchegrov et al.

FOREIGN PATENT DOCUMENTS

TW 200609483 A 3/2006
WO WO 2019/115391 A1 6/2019

OTHER PUBLICATIONS

Office Action issued by the Intellectual Property Office (IPO) in related ROC (Taiwan) Patent Application No. 109144631, mailed Aug. 5, 2021 (12 pgs.).

(Continued)

*Primary Examiner* — Ruiping Li
(74) *Attorney, Agent, or Firm* — Finnegan, Henderson, Farabow, Garrett & Dunner LLP

(57) ABSTRACT

A metrology method comprising: performing a first exposure on a substrate to form a first patterned layer including a plurality of first target units, each first target unit comprising a first target feature; performing a second exposure on the substrate to form a second patterned layer comprising second target units overlying respective ones of the first target units, each of the second target units having a second target feature, wherein ones of the second target units have the second target feature positioned at respectively different offsets relative to a reference position: imaging the second target units overlaid on the first target units; and determining an edge placement error based on positions of edges of second target features in second target units relative to edges of the first target feature of the underlying first target unit.

22 Claims, 9 Drawing Sheets

(51) Int. Cl.
*G06T 7/13* (2017.01)
*G06T 7/194* (2017.01)

(52) U.S. Cl.
CPC ................ *G06T 7/13* (2017.01); *G06T 7/194* (2017.01); *G06T 2207/10061* (2013.01); *G06T 2207/30148* (2013.01)

(58) Field of Classification Search
CPC . G06T 2207/30148; G06T 7/001; G06T 7/13; G06T 7/194
See application file for complete search history.

(56) References Cited

OTHER PUBLICATIONS

International Search Repot issued by the International Searching Authority in related PCT Application No. PCT/EP2020/087345, mailed Apr. 20, 2021 (2 pgs.).
Office Action of the Intellectual Property Office of Taiwan issued in related Taiwanese Patent Application No. 109144631; mailed Feb. 6, 2023 (13 pgs.).

* cited by examiner

METROLOGY METHOD

CROSS-REFERENCE TO RELATED APPLICATIONS

This application claims priority to International Application No. PCT/EP2020/087345, filed Dec. 19, 2020, and published as WO 2021/130142 A1, which claims priority of EP Application Serial No. 19219624.4 which was filed on Dec. 24, 2019. The contents of these applications are incorporated herein by reference in their entireties.

FIELD

The present disclosure relates to metrology methods and targets, in particular for device manufacturing using lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Most semiconductor devices require a plurality of pattern layers to be formed and transferred into the substrate. For proper functioning of the device, there is usually a limit on the tolerable error in the positioning of edges, known as edge placement error or EPE. EPE can arise because of errors in the relative positioning of successive layers, known as overlay, or due to errors in the dimensions (specifically the critical dimension or CD) of features. With the continual desire in the lithographic art to reduce the size of features that can be formed (shrink), the limits on EPE are becoming stricter.

Overlay can arise from a variety of causes in the lithographic process, for example errors in the positioning of the substrate during exposure and aberrations in the projected image. Overlay can also be caused during process steps, such as etching, which are used to transfer the pattern into the substrate. Some such process steps generate stresses within the substrate that lead to local or global distortions of the substrate. The formation of three dimensional structures on the substrate, such as is required for recently developed memory types and MEMS, can also lead to significant distortions of the substrate. CD variation can also derive from a variety of causes, including dose or focus errors.

SUMMARY

The present disclosure aims to provide improved metrology methods, e.g. for use in lithographic device manufacturing processes.

According to an embodiment there is provided an inspection tool comprising:

an imaging system configured to image a target formed on a substrate, the target comprising a plurality of first target units formed in a first patterned layer, each first target unit comprising a first target feature, and a plurality of second target units formed in a second patterned layer overlying respective ones of the first target units, each of the second target units having a second target feature, wherein ones of the second target units have the second target feature positioned at respectively different offsets relative to a reference position; and an image analysis system configured to determine an edge placement based on positions of edges of second target features in second target units relative to edges of the first target feature of the underlying first target unit.

According to an embodiment there is provided a metrology method comprising:

performing a first exposure on a substrate to form a first patterned layer including a plurality of first target units, each first target unit comprising a first target feature;

performing a second exposure on the substrate to form a second patterned layer comprising second target units overlying respective ones of the first target units, each of the second target units having a second target feature, wherein ones of the second target units have the second target feature positioned at respectively different offsets relative to a reference position;

imaging the second target units overlaid on the first target units; and determining an edge placement error based on positions of edges of second target features in second target units relative to edges of the first target feature of the underlying first target unit.

BRIEF DESCRIPTION OF THE DRAWINGS

Embodiments will now be described, by way of example, with reference to the accompanying drawings in which.

DETAILED DESCRIPTION

Figure 1:
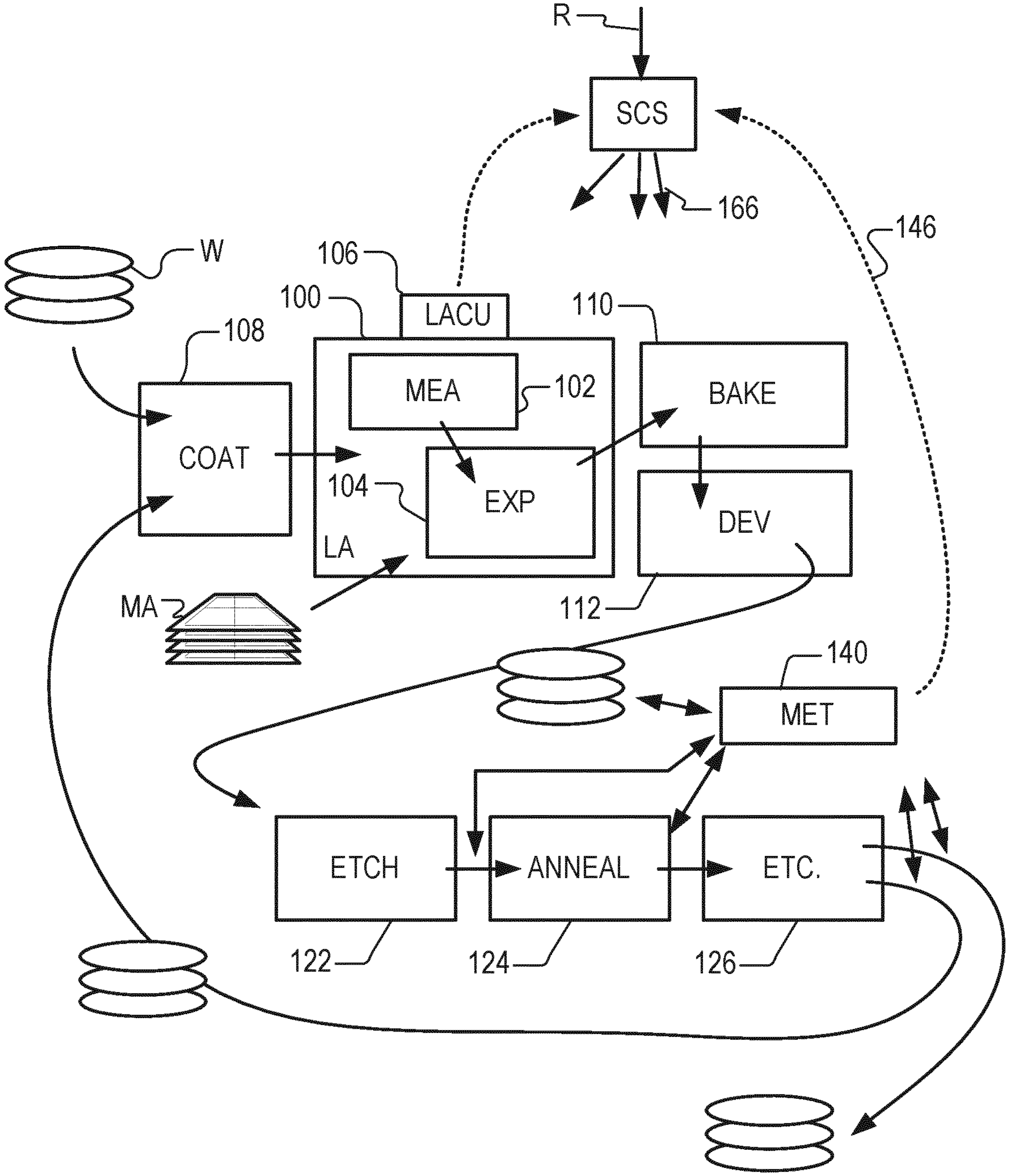
FIG. 1 depicts a lithographic apparatus together with other apparatuses forming a production facility for semiconductor devices.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smartphone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning electron microscope (SEM), an optical inspection system, etc. Such systems can be used to image these structures, in effect, taking a "picture" of the structures of the wafer, with a SEM being able to image the smallest of these structures. The image can be used to determine if the structure was formed properly in the proper location. If the structure is defective, then the process can be adjusted, so the defect is less likely to recur.

In order to control errors in a lithographic manufacturing process, such as errors in the relative position of features in different layers (known as overlay) and the size of features (known as CD variation), it is necessary to measure the errors, such as by use of a SEM, an optical inspection system, etc., before corrections can be applied. It is difficult to directly measure features of a device formed by lithography. Therefore, special targets are formed at the same time as the device features. The targets are designed to be easier to image, for example with scanning electron microscopes, and to behave in the same way as the device features, e.g. if a device feature suffers from an overlay error the target will suffer from the same error. However, even though the targets are easier to image than the device features, it is still difficult to make accurate measurements of absolute distances in those images, especially if different imaging devices are used or if the features are measured at different stages in the manufacturing process. Disclosed below, among others, are new methods and arrangements of targets that enable absolute values of errors such as overlay to be determined without the need to make direct measurements in SEM images.

In an example of the new targets, each target has multiple target sub-units all of which have the same two features but in different target sub-units one of the features is located at a different position relative to the other. Because of the range of relative positions of the two features, a positional error will cause an overlap of the edges of the two features in at least one of the targets. Knowing the initial positional variations, the size of the positional error can be determined by identifying in which target the two features' edges overlap. In other examples, the positional error can be determined by comparing images of different sub-units, possibly after cropping, rotation and/or reflection of one image. Thus, it is no longer necessary to make a direct measurement of the position of two features and a more accurate determination of the size of an error can be achieved.

Before describing embodiments in detail, it is instructive to present an example environment in which the techniques disclosed herein may be implemented.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles or other shapes aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may give rise to an overlay error (often referred to as "overlay"). The overlay is the error in placing a first product feature within a first layer relative to a second product feature within a second layer. The lithographic apparatus reduces the overlay errors by aligning each wafer accurately to a reference prior to patterning. This is done by measuring positions of alignment marks which are applied to the substrate. Based on the alignment measurements the substrate position is controlled during the patterning process in order to prevent occurrence of out of tolerance overlay errors. Alignment marks are typically created as part of the product image forming the reference to which overlay is measured. Alternatively, alignment marks of a previously formed layer can be used.

An error in a critical dimension (CD) of the product feature may occur when the applied dose associated with the exposure 104 is not within specification. For this reason, the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus reduces these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. Common examples of a metrology apparatus are scatterometers and scanning electron microscopes. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. A CD metrology target is used for measuring the result of the most recently exposed layer. An overlay target is used for measuring the difference between the positions of the previous and most recent layers. An electron beam (e-beam) based inspection tool such as a scanning electron microscope (SEM) can often provide superior results in the measurement of small overlay and CD values.

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. The metrology apparatus is configured to inspect substrates after development 112 or after further processing (e.g. etching). The various apparatus within the litho cell are controlled by a supervisory control system SCS, which issues control signals 166 to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates. The SCS can be one computer or multiple computers, which may or may not communicate. The recipe R can be implemented as one recipe or as multiple independent recipes. For example, the recipe for a process step such as etch may be totally independent of the recipe to inspect the result of that process step (e.g. etch). For example, two or more recipes for individual steps may be interrelated such that one recipe is adjusted to take account of the results of performance of another recipe on the same or a different substrate.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example, context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

To qualify the process window, separate CD and overlay measurements are performed with one or more of the existing tools and combined into an edge placement error (EPE) budget. Often, one metrology step might be performed after development (ADI) and another after an etch step (AEI), and there are inherent difficulties in calibrating two such different measurements to give equivalent results.

EPE is very important to ensure a semiconductor device is working properly, for example it may affect whether, in a back end of line module, there is sufficient electrical contact. This makes EPE measurements very valuable to ensuring the process window accommodates a sufficient EPE budget and to controlling the process to remain within window.

A target design to facilitate EPE determination, e.g. after etch, is proposed. A measurement after etch can be desirable because it better represents the final patterned structure. In addition, after-etch measurement sees the contributions of the etcher and other tools, such as deposition and CMP, to the final pattern. A measurement after development (before pattern transfer) is also desirable as it may enable defective exposures to be reworked rather than scrapped.

The target corresponds to a pattern of interest but a part of the pattern has a displacement offset or bias. To measure overlay, the target has components (features) in the same two layers as the pattern of interest and the target features in each layer correspond to the device features in the corresponding layer. The device features may also be referred to as product features or pattern features. In an embodiment, either or both features of the target correspond exactly to device features of interest. If optical proximity correction (OPC) features are applied to the device features they are desirably also applied to the target features. Desirably the target features have the same pitch as the device features (e.g. dense, semi-dense or isolated). Desirably the target features have the same CD as the device features. In particular, if a device feature is elongate (such as a line feature), the target feature need not be as long as the device feature but the target feature is desirably long enough to behave similarly to the device feature. If the device has an array of features, e.g. parallel lines or a grid of contact holes, the target need not have the same extent as the array of device features but desirably has at least two unit cells of the array.

The target has a plurality of parts, referred to herein as target units. The various target units provide a range of different offsets between the two features. This enables the self-calibration of metrology by designing multiple displacement offsets on the reticle level which allows the direct determining of the recipe accuracy. Desirably all subunits of the target fit within the field of view of a metrology tool that is to be used to measure the target. For example, the target can be smaller than 40 μm by 40 μm. The various target units need not be demarcated by structure. For example, if a first target feature comprises elongated lines and a second target feature is a cut feature, the several target units may be formed by cut features positioned along a continuous set of lines.

An exemplary target for measuring edge placement error (EPE) in a line layer and a cut-layer will now be described with reference to FIGS. 2A to C, 3A to F and 4A to C.

Figure 2A:
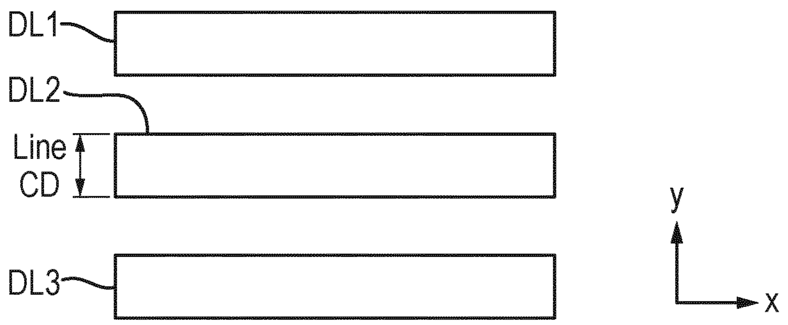
FIGS. 2A to 2C depict steps in a process of forming a cut-line.
Figure 2B:
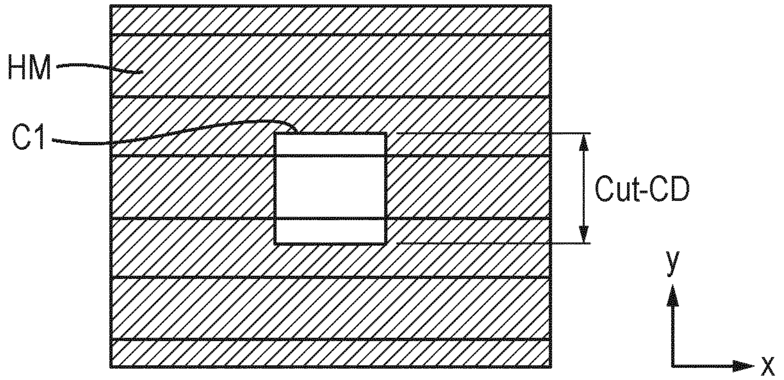
Figure 2C:
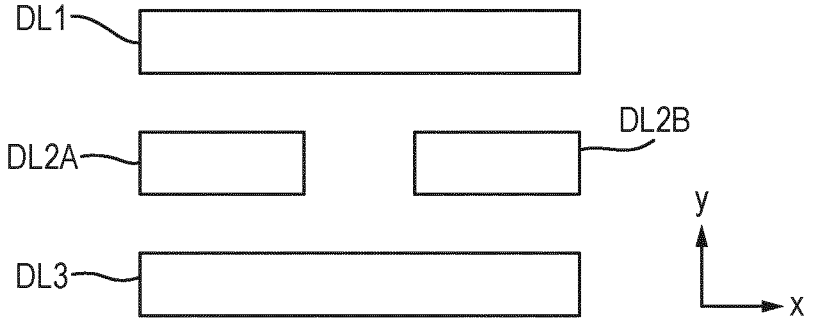
Figure 3A:
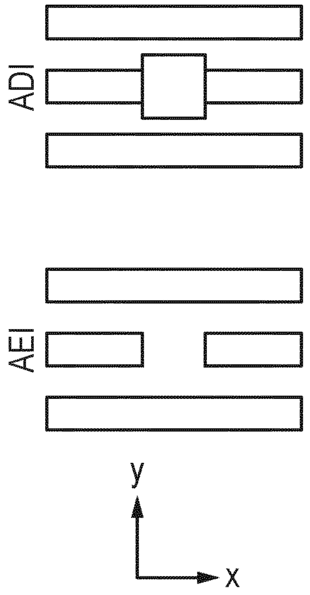
FIGS. 3A to 3F depict the effect of variations in the position of a cut-feature in device features and a target.
Figure 3B:
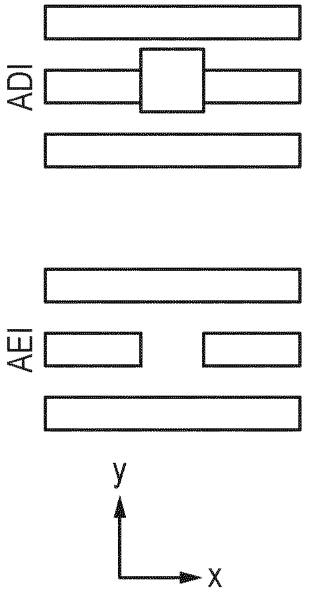
Figure 3C:
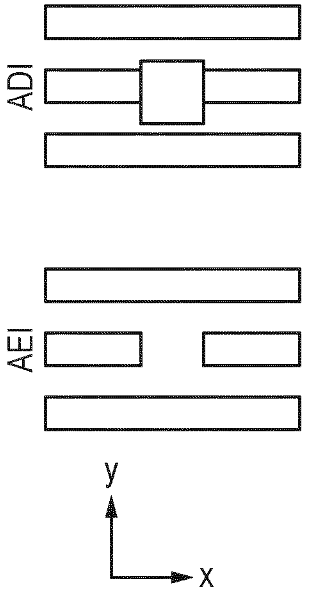

The device layout is shown in FIGS. 2A to C: FIG. 2A shows three lines DL1-3 in the line layer and FIG. 2B shows the cut feature Cl formed in a hardmask HM or lithography stack (e.g. resist, adhesion layer, BARC, etc.). FIG. 2C shows the line layer after etching: line DL2 is split into two lines DL2A and DL2B. However, it is difficult to detect small variations in CD-y and overlay-y in after etch inspection. CD-y means the critical dimension in the y-direction and overlay-y means overlay in the y-direction. This is illustrated in FIGS. 3A to C in which the top parts show the situation after development and the bottom parts show the situation after etch. It can be seen that small variations in the position of the cut feature that are detectable in after-development inspection do not result in any detectable difference in the after-etch inspection results because the cut feature is bigger than the line.

Figure 3D:
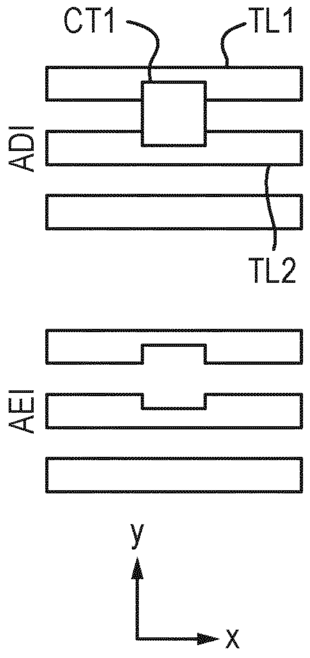

A target unit according to an embodiment is shown in FIG. 3D, in which the top part shows the situation after development and the bottom part shows the situation after etch. As can be seen, the target unit corresponds to the device features except that the cut-layer origin is displaced in the y-direction by line pitch/2. This means that the target cut feature CT1 overlaps two target line features TL1, TL2 symmetrically but incompletely so that each target line is half-cut. Edges of the target cut feature CT1 fall within the target line features TL1, TL2. This has the effect that the cut CD-y is clearly detectable in the target layout after etch. The target feature is positioned so that its relevant edges are detectable after processing.

Figure 3E:
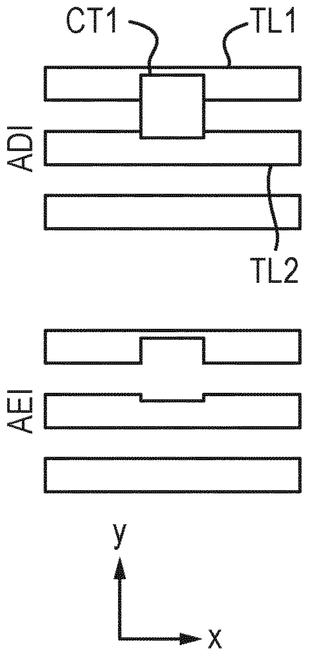
Figure 3F:
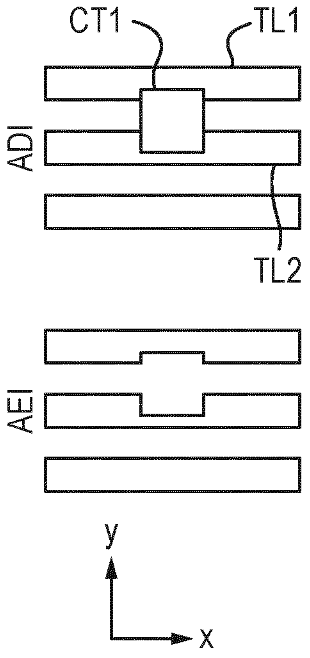
Figure 4A:
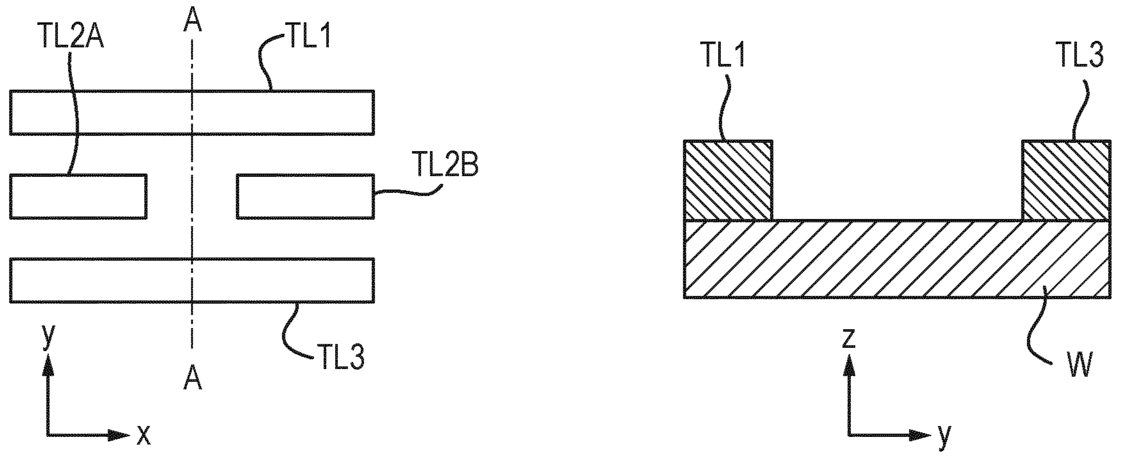
FIGS. 4A to 4C depict the effect of opposite shifts in the position of cut-features.
Figure 4B:
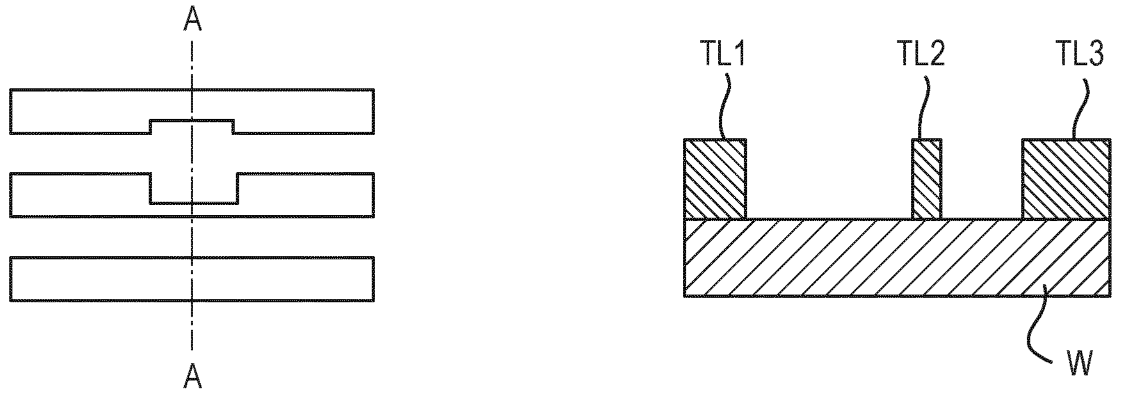
Figure 4C:
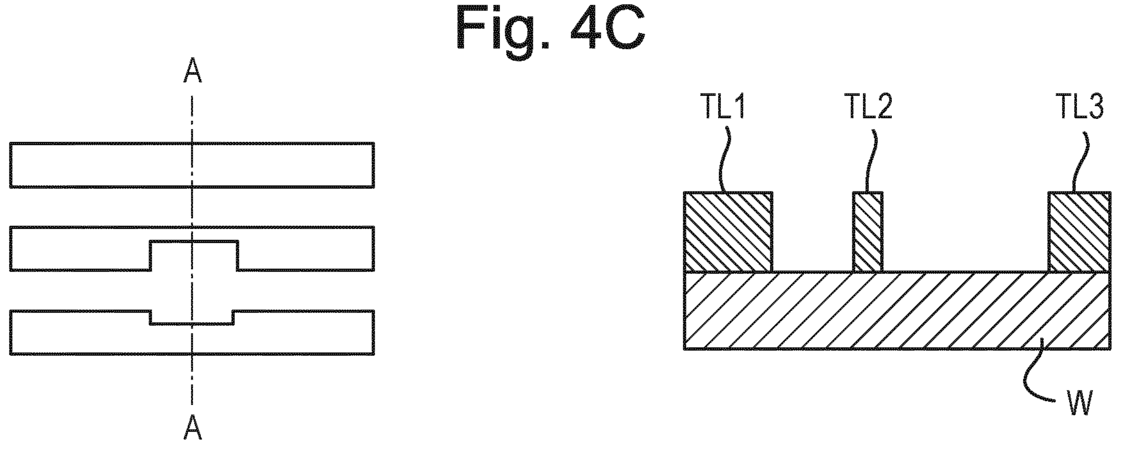
Figure 6:
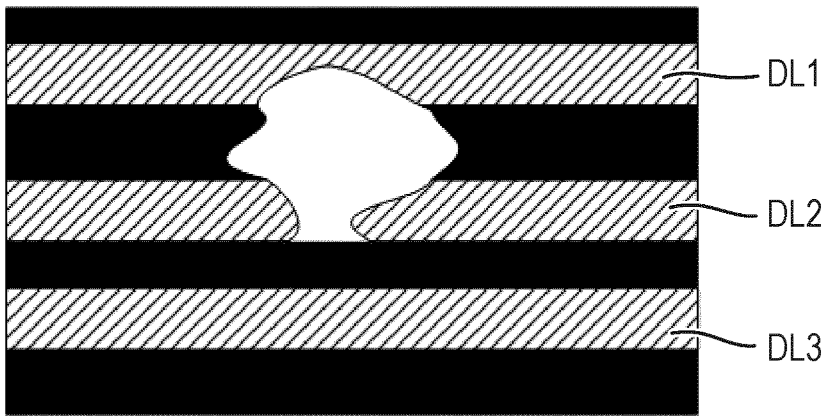
FIG. 6 depicts an example of an SEM image of a target feature in an embodiment.

FIGS. 3E and 3F show the effect of an overlay error in the +y and −y directions respectively, again the top parts show the situation after development and the bottom parts show the situation after etch. The effect of an overlay error is that the half-cut in one of the target lines increases while the other decreases. Therefore, the direction (positive or negative) of an overlay error can be determined without requiring measurements of images of the target, simply by considering in which direction the target is asymmetric. This can also be seen in FIGS. 4A to C, which show on the left a plan view and on the right a cross-section of the situation after etching of the cut feature. In FIG. 4A, the central line TL2 is completely cut whereas in FIGS. 4B and 4C a remnant is left, with its location depending on the direction in which the cut feature is offset. It will be appreciated that an actual SEM image, an example of which is shown in FIG. 6, differs considerably from the idealized schematic figures presented here but the position of the cut feature is still readily discernible.

Figure 5:
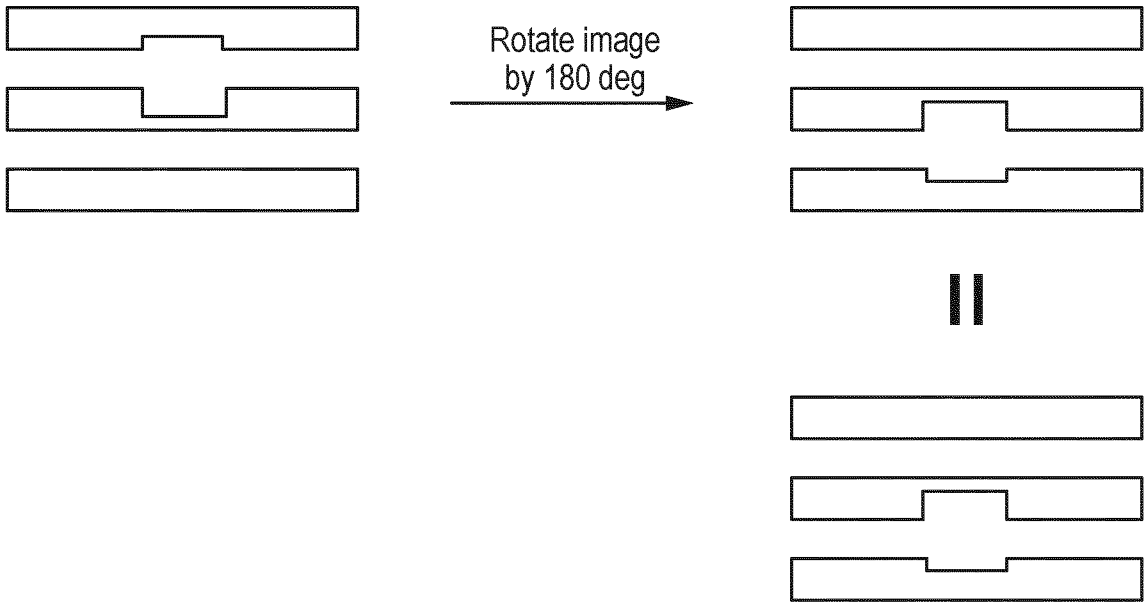
FIG. 5 depicts the equivalence of oppositely biased features under rotation.

To determine a magnitude of a positional error—such as overlay, CD or edge placement error—it is possible to make use of any symmetry in the target. In the case of the target shown in FIG. 5, an image of the target with overlay-y of −A nm rotated by 180° looks like an image of a target with overlay-y of +A nm. In this example, the same effect can be achieved by reflecting one of the images. Therefore, by providing a plurality of targets with different biases (displacements of the second target feature at mask level) and checking for symmetric pairs the magnitude of an actual overlay can be determined. For example, if an array of targets with biases ±n nm, where n=1, 2, 3, etc., is printed and the rotated after-etch image of the target with +1 nm bias matches the after-etch image of the target with bias −3 nm then there is an overlay of +1 nm. This is because the actual position of the second feature in the +1 nm biased target is +2 nm (bias+actual overlay=1+1=2) and the actual position of the second feature in the −3 nm biased target is −2 nm (bias+actual overlay=−3+1=−2). Similar techniques can be applied to determine CD or edge placement error (the combination of CD and overlay), optionally by considering only one edge of the target feature. In other target patterns different symmetry operations or combinations of symmetry operations can be used before comparing target units. In some cases, the image transformation and comparison process can be carried out on only a part of the image of the target unit.

The above approach does not require a measurement of an absolute distance in the images provided by the metrology tool and can thus be considered self-calibrating. This approach can also be applied to non-imaging metrology tools, such as scatterometers. The desired range of measurement and resolution can be set by appropriate selection of the number of targets and size of the variation in bias (e.g. ±n*0.5 nm, ±n*1 nm, ±n*2 nm).

In the example of the target comprising lines and a cut feature, in each target unit the cut feature is offset by a distance D, where D=±n*1 nm, where n=1, 2, 3, etc. Desirably the values of n are such that the range of offsets in each direction is comparable to the distance between the nominal positions of adjacent edges of the two target features (which desirably corresponds to the distance between the nominal positions of edges of two device features). In other words, |Dmax|≥|pattern 1 edge−pattern 2 edge|. The nominal position of a feature or edge is its position if correctly imaged and may also be referred to as the design position.

Figure 7:
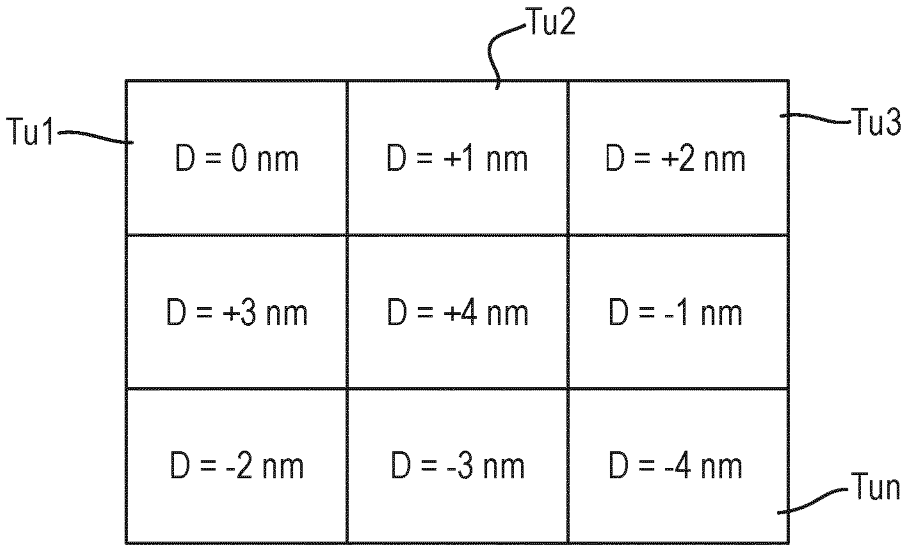
FIG. 7 depicts an example arrangement of composite target comprising sub-targets of different bias.

FIG. 7 shows an example of an array of target units TU1, TU2, . . . , TUn. Each target unit can have dimensions less than about 5 μm by 5 μm, e.g. 2 μm by 2 μm. An array of 9 or more target units can easily fit within the field of view of a metrology tool enabling overlay and/or CD to be determined with a single measurement. The array of target units can easily fit within a scribe lane or within product areas if appropriate.

Whilst a target having lines extending in the x-direction for measuring CD and overlay in the y-direction has been illustrated, it will be appreciated that the whole arrangement can be rotated 90° to measure overlay and CD in the x-direction. A composite target might include target units of both orientations. However, in a device layer having only or predominately lines extending in x or y it may be sufficient to measure overlay and CD in one direction only.

Figure 8A:
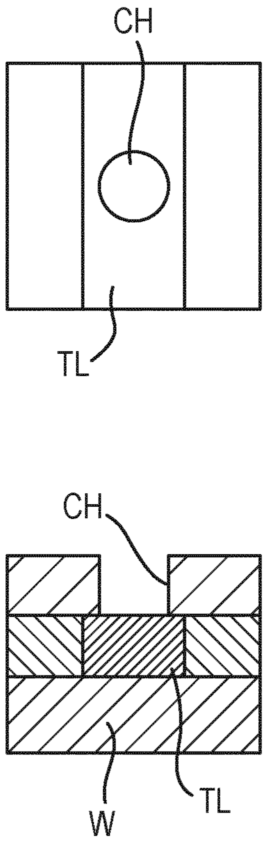
FIGS. 8A to 8C depict the effect of variation in the position of a contact hole relative to a line in plan and cross-sectional views.
Figure 8B:
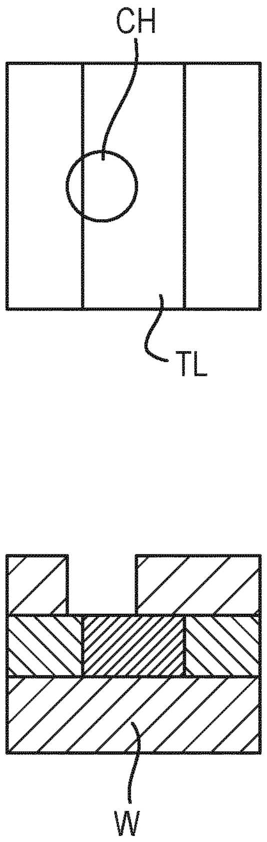
Figure 8C:
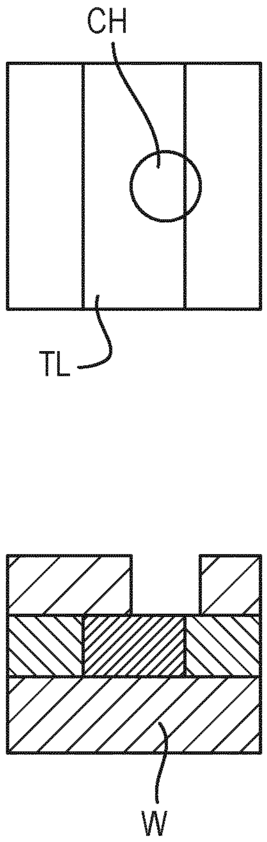

Another set of target units is shown in FIGS. 8A to C for use with a pattern of contact holes (vias) that are to contact lines. In each case the top part is a plan view and the bottom part a corresponding cross-section. In a first target unit (FIG. 8A) the contact hole CH is aligned with the center of the target line feature TL (which in this example extends in the y direction). In the second target unit (FIG. 8B) the contact hole feature CH has a predetermined offset in the −ve x-direction and in the third target unit (FIG. 8C) the contact hole feature CH has a predetermined offset in the +ve x-direction. The size of the contact hole and the offsets in the second and third target units are chosen so that with fully correct imaging and patterning (i.e. overlay and CD well within process window) no edge of the underlying line is visible in the first target unit but the edge is visible in the second and third target units. If there is an overlay error of sufficient magnitude shifting the contact hole target features in the +ve x-direction relative to the line feature, then the edge of the line feature will become visible in the contact hole of the first target unit and disappear from the contact hole target feature of the second target unit. Conversely an overlay error in the −x direction will cause the edge of the line feature to appear in the first target unit and dis-appear in the third target unit. A −ve CD error of sufficient magnitude cause the edges to appear in the first target unit and move in the second and third target units. A +ve CD error would cause the edges of the line feature to disappear from both the second and third target units. Thud different types of errors can be distinguished between by consideration of in which target units edges are visible. Provision of additional target units with different offsets can enable detection of different types of error and different magnitudes of error over a wider range and/or with higher resolution.

In another embodiment, an array of targets with biases ±n nm, where n=1, 2, 3, etc. are printed. Advantageously, from such an array, EPE can be determined without requiring any precise measurements. In some cases, EPE is an error in a location of an edge of a first target with an edge of a second target. In an example to illustrate this concept, a cut hole is targeted to be placed on a metal line with an outer edge of the cut located 3 nm from an edge of the metal line. In one case, the metal line is oversized by 1 nm and the cut hole is placed 1 nm too close to the line edge. In this case, the EPE is zero because the two errors cancel each other out. In another case, the metal line is oversized by 1 nm and the cut hole is placed 1 nm too far from the line edge. In this case, the EPE is 2 nm because the two errors are additive. In an example where EPE can be determined without requiring any precise measurements, an array of targets with biases as described above are printed. In one of the targets, the edge of the cut aligns with the edge of the metal (including the overlay error and CD error). This is determined by inspecting the array of targets, where the cut can be seen getting closer to the edge of the metal line, as can be seen between FIG. 3D where the top edge of CT1 is in the middle of TL1, and in FIG. 3E where the top edge of CT1 is closer to the top edge of TL1. In an array of such targets, the top edge of CD1 will get closer to the top edge of TL1 and, at one of the biases, the two edges will align. As the array of targets continues, the top edge of CT1 will go beyond the top of TL1. Based on the first of the array of targets where CT1 cuts through TL1, the EPE can be determined just by knowing the bias of that particular target.

Figure 9A:
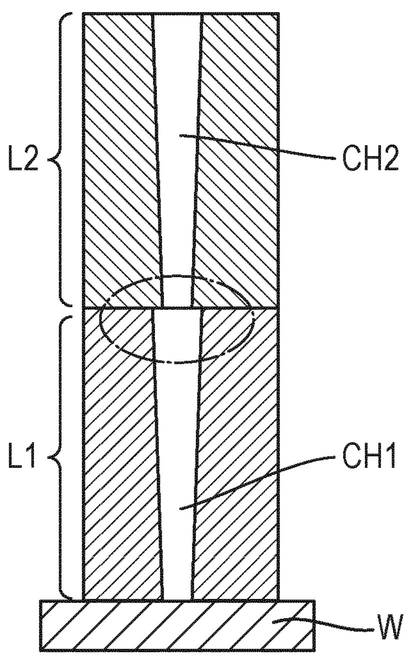
FIGS. 9A to 9C depict an arrangement of vertically aligned channel holes and the effect of positional errors.
Figure 9B:
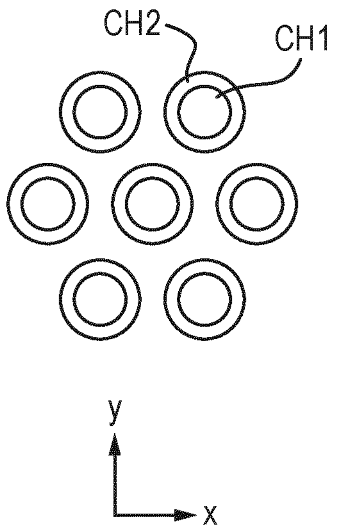
Figure 9C:
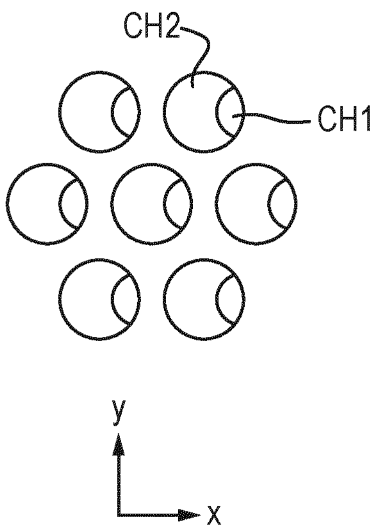

FIGS. 9A to C illustrate an embodiment applied to a pattern of upper channel holes CH2 (e.g. memory channel holes in a 3D-NAND device) that are to be placed above lower channel holes CH1 as shown in FIG. 9A. Accurate alignment of the two layers of channel holes is desirable to ensure a good electrical connection. FIG. 9B is a schematic view of a target unit comprising an array of channel hole features in the after-etch situation in a case with good alignment. FIG. 9C shows a corresponding view in a misaligned example: only a part of the edge of the lower contact hole is visible. A target for use with such a pattern comprises a plurality of target holes in the upper layer at a variety of offsets relative to the channel holes in the lower layer. The offsets may include offsets in the x-direction, the y-direction and/or both x- and y-directions.

Figure 10:
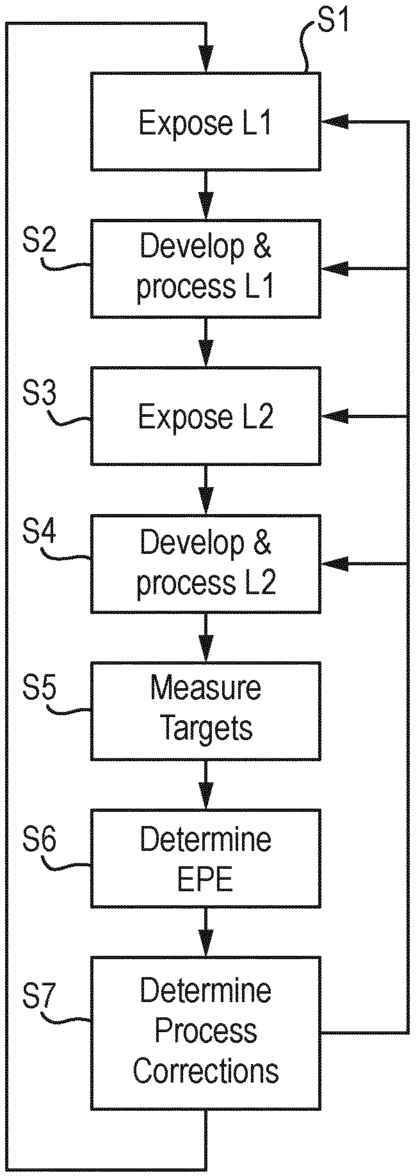
FIG. 10 depicts a flow chart of a method according to an embodiment.

An exemplary method is depicted in FIG. 10, which is a flow chart. A first layer L1 is exposed S1, then developed and processed (e.g. by etching) S2. In the examples of FIGS. 3D to F and 8A to C, the line features are formed in these steps. In the example of FIGS. 9A to C the lower channel holes are formed. A second layer L2 is exposed S2, then developed and processed (e.g. by etching) S4. In the examples of FIGS. 3D to F the cut features are formed in these steps. In the examples of FIGS. 8A to C, the contact hole features are formed in these steps. In the example of FIGS. 9A to C the upper contact holes are formed. Thus, the first layer L1 includes first target features of the plurality of target units and the second layer L2 includes second target features of the plurality of target units.

The target units are then measured S5, e.g. using a scanning electron microscope. Desirably all target units are imaged in a single image generated by the metrology tool. Based on the measurement results, any edge placement errors (EPE) are detected and characterized, e.g. by detecting the presence and/or position of edges in the image(s) of target units or by considering the symmetry of processed (e.g. cropped, rotated and/or reflected) images and normal images of different target units. In the event that out-of-budget edge placement errors are detected, appropriate process corrections are determined S7 and fed back to the expose and develop/process steps S1-S4.

It will therefore be seen that the techniques disclosed herein can provide self-calibrating targets, e.g. for detecting edge placement errors using scanning electron microscopes or scatterometry-based metrology tools. These self-calibrating targets can provide improved accuracy and avoid the need for a tool-of-reference.

The techniques disclosed herein can enable multiple EPE parameters to be extracted in one metrology step which improves processing cycle time.

The techniques disclosed herein can reduce the need for very high-voltage SEM so the measurement is less destructive.

The techniques disclosed herein can reduce the complexity of SEM processes.

The techniques disclosed herein do not need metals to be available to measure EPE, as is required for voltage contrast methods, increasing flexibility.

The techniques disclosed herein can be used in in-line measurements for control loops and wafer disposition.

The techniques disclosed herein can be applied, amongst other things, to:

1D and 2D patterns in FEOL (front-end-offline), MOL (middle of line) and BEOL (back-end-offline)

block layers in BEOL

Litho etch-Litho etch (LELE)

While specific techniques have been described above, it will be appreciated that the disclosure may be practiced otherwise than as described.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to optical lithography, it will be appreciated that the techniques disclosed herein may be used in other applications, for example imprint lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Aspects of the present disclosure are set out in the following numbered clauses:

1. A metrology method comprising:
   - performing a first exposure on a substrate to form a first patterned layer including a plurality of first target units, each first target unit comprising a first target feature;
   - performing a second exposure on the substrate to form a second patterned layer comprising second target units overlying respective ones of the first target units, each of the second target units having a second target feature, wherein ones of the second target units have the second target feature positioned at respectively different offsets relative to a reference position;
   - imaging the second target units overlaid on the first target units; and
   - determining an edge placement error based on positions of edges of second target features in second target units relative to edges of the first target feature of the underlying first target unit.

2. A method according to clause 1, wherein the imaging is performed using a scanning electron microscope.

3. A method according to clause 1 or 2, wherein the different offsets vary across a range greater than or equal to a distance between a nominal position of an edge of the first target feature and a nominal position of an edge of the second target feature.

4. The method according to any one of the preceding clauses, wherein the second target units include at least one pair of second target units in which the respective second target features have opposite offsets.

5. The method according to any one of the preceding clauses, wherein the offsets of the second target features in the second target units are oriented in one direction.

6. The method according to any one of clauses 1 to 4, wherein the offsets of the second target features in the second target units include offsets oriented in more than one direction.

7. The method according to any one of the preceding clauses, wherein there are at least 5, at least 7 or at least 9 first target units and second target units.

8. A method according to any one of the preceding clauses, wherein the imaging obtains a single image of multiple second target units overlaid on first target units.

9. A method according to any one of the preceding clauses, wherein the first patterned layer comprises a plurality of first device features; the second patterned layer comprises a plurality of second device features; the first target features correspond to the first device features; and the second target features correspond to the second device features.

10. A method according to clause 9, wherein positions of the second target features relative to the first target features are different than positions of the second device features relative to the first device features.

11. A method according to any one of the preceding clauses wherein the first and second target units are configured to enable determination of a magnitude of a positional error by detecting in which of the target units a predetermined positional relationship of feature edges exists.

12. A method according to any one of the preceding clauses, wherein the first device features and the second device features are separately selected from the group consisting of lines, cut features, block features and holes.

13. A method according to any one of the clauses 1 to 12, wherein the first and second device features are features of successive exposures of a litho-etch-litho-etch pattern.

14. A method according to any one of the preceding clauses wherein the first and second target units are formed in a scribe lane.

15. A method according to any one of the preceding clauses wherein the imaging is performed after development of the second patterned layer.

16. A method according to any one of the preceding clauses wherein the imaging is performed after a pattern transfer step of the second patterned layer.

17. A device manufacturing method comprising performing a metrology method according to any one of the preceding clauses; determining a process correction based at least in part on the edge placement error; and repeating the first exposure and second exposure while applying the process correction.

18. A mask set for use in lithographic apparatus to form a first patterned layer including a plurality of first target units, each first target unit comprising a first target feature; and a second patterned layer comprising second target units overlying respective ones of the first target units, each of the second target units having a second target feature, wherein ones of the second target units have the second target feature positioned at respectively different offsets relative to a reference position.

19. A mask set according to clause 18, wherein the different offsets vary across a range greater than or equal to a distance between a nominal position of an edge of the first target feature and a nominal position of an edge of the second target feature.

20. The mask set according to any one of clauses 18 or 19, wherein the second target units include at least one pair of second target units in which the respective second target features have opposite offsets.

21. A mask set according to any one of clauses 18 to 19, wherein multiple second target units overlaid on first target units are positioned to be captured in a single image.

22. A mask set according to any one of clauses 18 to 21, wherein the first patterned layer comprises a plurality of first device features; the second patterned layer comprises a plurality of second device features; the first target features correspond to the first device features; and the second target features correspond to the second device features.

23. A mask set according to clause 22, wherein positions of the second target features relative to the first target features are different than positions of the second device features relative to the first device features.

24. A mask set according to any one of clauses 18 to 23, wherein the first device features and the second device features are separately selected from the group consisting of lines, cut features, block features and holes.

25. A mask set according to any one of clauses 18 to 23, wherein the first and second device features are features of successive exposures of a litho-etch-litho-etch pattern.

26. A mask set according to any one of clauses 18 to 25 wherein the first and second target units are formed in a scribe lane.

27. A mask set according to any one of clauses 18 to 26 wherein the first and second target units are configured to enable determination of a magnitude of a positional error by detecting in which of the target units a predetermined positional relationship of feature edges exists.

28. A substrate having a first patterned layer including a plurality of first target units, each first target unit comprising a first target feature; and a second patterned layer comprising second target units overlying respective ones of the first target units, each of the second target units having a second target feature, wherein ones of the second target units have the second target feature positioned at respectively different offsets relative to a reference position.

29. A substrate according to clause 28 wherein the first and second target units are configured to enable determination of a magnitude of a positional error by detecting in which of the target units a predetermined positional relationship of feature edges exists.

30. A computer program comprising code means that, when executed by a supervisory control system, instruct one or more lithographic tools to perform a method according to any one of clauses 1 to 17.

31. An inspection method comprising:
- imaging a target formed on a substrate, the target comprising a plurality of first target units formed in a first patterned layer, each first target unit comprising a first target feature, and a plurality of second target units formed in a second patterned layer overlying respective ones of the first target units, each of the second target units having a second target feature, wherein ones of the second target units have the second target feature positioned at respectively different offsets relative to a reference position; and
- determining an edge placement error based on positions of edges of second target features in second target units relative to edges of the first target feature of the underlying first target unit.

32. An inspection tool comprising:
- an imaging system configured to image a target formed on a substrate, the target comprising a plurality of first target units formed in a first patterned layer, each first target unit comprising a first target feature, and a plurality of second target units formed in a second patterned layer overlying respective ones of the first target units, each of the second target units having a second target feature, wherein ones of the second target units have the second target feature positioned at respectively different offsets relative to a reference position; and
- an image analysis system configured to determine an edge placement based on positions of edges of second target features in second target units relative to edges of the first target feature of the underlying first target unit.

33. An inspection tool according to clause 32 wherein the image analysis system is configured to determine a magnitude of a positional error by detecting in which of the target units a predetermined positional relationship of feature edges exists.

34. An inspection tool according to clause 32 or 33, wherein the imaging system comprises a scanning electron microscope.

35. An inspection tool according to clause 32, 33, or 34, wherein the imaging system is configured to image a target in which the different offsets vary across a range greater than or equal to a distance between a nominal position of an edge of the first target feature and a nominal position of an edge of the second target feature.

36. The inspection tool according to any one of clauses 32 to 35, wherein the imaging system is configured to image a target in which the second target units include at least one pair of second target units in which the respective second target features have opposite offsets.

37. The inspection tool according to any one of clauses 32 to 36, wherein the imaging system is configured to image a target in which the offsets of the second target features in the second target units are oriented in one direction.

38. The inspection tool according to any one of clauses 32 to 37, wherein the imaging system is configured to image a target in which the offsets of the second target features in the second target units include offsets oriented in more than one direction.

39. The inspection tool according to any one of clauses 32 to 38, wherein the imaging system is configured to image a target in which there are at least 5, at least 7 or at least 9 first target units and second target units.

40. An inspection tool according to any one of clauses 32 to 39, wherein the imaging system is configured to obtain a single image of multiple second target units overlaid on first target units.

41. An inspection tool according to any one of clauses 32 to 40, wherein the imaging system is configured to image a target in which the first patterned layer comprises a plurality of first device features; the second patterned layer comprises a plurality of second device features; the first target features correspond to the first device features; and the second target features correspond to the second device features.

42. An inspection tool according to clause 41, wherein the imaging system is configured to image a target in which positions of the second target features relative to the first target features are different than positions of the second device features relative to the first device features.

43. An inspection tool according to any one of clauses 32 to 42, wherein the imaging system is configured to image a target in which the first device features and the second device features are separately selected from the group consisting of lines, cut features, block features and holes.

44. An inspection tool according to any one of clauses 32 to 42, wherein the imaging system is configured to image a target in which the first and second device features are features of successive exposures of a litho-etch-litho-etch pattern.

45. An inspection tool according to any one of any one of clauses 32 to 44 wherein the imaging system is configured to image a target formed in a scribe lane.

46. An inspection tool according to any one of clauses 32 to 45 wherein the imaging system is configured to perform the imaging after development of the second patterned layer.

The breadth and scope of the present the techniques disclosed herein should not be limited by any of the above-described exemplary embodiments, but should be defined only in accordance with the following claims and their equivalents.

The invention claimed is:

1. An inspection tool comprising:

an imaging system configured to image a target formed on a substrate, the target comprising a plurality of first target units formed in a first patterned layer, each first target unit comprising a first target feature, and a plurality of second target units formed in a second patterned layer overlying respective ones of the first target units, each of the second target units having a second target feature, wherein ones of the second target units have the second target feature positioned at respectively different offsets relative to a reference position; and an image analysis system comprising one or more computers and configured to determine an edge placement based on positions of edges of second target features in second target units relative to edges of the first target feature of the underlying first target unit and based on a symmetry between a first portion of the target and a second portion of the target.

2. The inspection tool according to claim 1 wherein the image analysis system is configured to determine a magnitude of a positional error by detecting in which of the target units a predetermined positional relationship of feature edges exists.

3. The inspection tool according to claim 1, wherein the imaging system comprises a scanning electron microscope.

4. The inspection tool according to claim 1, wherein the imaging system is configured to image a target in which the different offsets vary across a range greater than or equal to a distance between a nominal position of an edge of the first target feature and a nominal position of an edge of the second target feature.

5. The inspection tool according to claim 1, wherein the imaging system is configured to image a target in which the second target units include at least one pair of second target units in which the respective second target features have opposite offsets.

6. The inspection tool according to claim 1, wherein the imaging system is configured to image a target in which the offsets of the second target features in the second target units are oriented in one direction.

7. The inspection tool according to claim 1, wherein the imaging system is configured to image a target in which the offsets of the second target features in the second target units include offsets oriented in more than one direction.

8. The inspection tool according to claim 1, wherein the imaging system is configured to image a target in which there are at least 5 first target units and second target units.

9. The inspection tool according to claim 1, wherein the imaging system is configured to obtain a single image of multiple second target units overlaid on first target units.

10. The inspection tool according to claim 1, wherein the imaging system is configured to image a target in which the first patterned layer comprises a plurality of first device features; the second patterned layer comprises a plurality of second device features; the first target features correspond to the first device features; and the second target features correspond to the second device features.

11. The inspection tool according to claim 10, wherein the imaging system is configured to image a target in which positions of the second target features relative to the first target features are different than positions of the second device features relative to the first device features.

12. The inspection tool according to claim 10 wherein the imaging system is configured to image a target in which the first device features and the second device features are separately selected from the group consisting of lines, cut features, block features and holes.

13. The inspection tool according to claim 1, wherein the imaging system is configured to image a target in which the first and second device features are features of successive exposures of a litho-etch-litho-etch pattern.

14. The inspection tool according to claim 1 wherein the imaging system is configured to image a target formed in a scribe lane.

15. A non-transitory computer readable medium storing a set of instructions that is executable by one or more processors of an inspection tool to cause the inspection tool to perform a method comprising:

performing a first exposure on a substrate to form a first patterned layer including a plurality of first target units, each first target unit comprising a first target feature;

performing a second exposure on the substrate to form a second patterned layer comprising second target units overlying respective ones of the first target units, each of the second target units having a second target feature, wherein ones of the second target units have the second target feature positioned at respectively different offsets relative to a reference position;

imaging the second target units overlaid on the first target units; and determining an edge placement error based on positions of edges of second target features in second target units relative to edges of the first target feature of the underlying first target unit and based on a symmetry between a first portion of the target and a second portion of the target.

16. The computer readable medium of claim 15, wherein the imaging is performed using a scanning electron microscope.

17. The computer readable medium of claim 15, wherein the different offsets vary across a range greater than or equal to a distance between a nominal position of an edge of the first target feature and a nominal position of an edge of the second target feature.

18. The computer readable medium of claim 15, wherein the second target units include at least one pair of second target units in which the respective second target features have opposite offsets.

19. The computer readable medium of claim 15, wherein the offsets of the second target features in the second target units are oriented in one direction.

20. The computer readable medium of claim 15, wherein the offsets of the second target features in the second target units include offsets oriented in more than one direction.

21. The computer readable medium of claim 15, wherein the image analysis system is configured to determine the edge placement based on the symmetry between the first portion of the target and the second portion of the target by determining that a first image of the first portion of the target corresponds to a rotation of a second image of the second portion of the target.

22. The computer readable medium of claim 15, wherein the image analysis system is configured to determine the edge placement based on the symmetry between the first portion of the target and the second portion of the target by comparing a first size of the first portion of the target to a second size of the second portion of the target.

* * * * *